US009621182B2

United States Patent
Lachartre (10) Patent No.: US 9,621,182 B2
(45) Date of Patent: Apr. 11, 2017

(54) CONTINUOUS-TIME QUANTIZATION DEVICE, RADIO FREQUENCY SIGNAL RECEIVER COMPRISING SUCH A DEVICE AND CONTINUOUS-TIME QUANTIZATION METHOD

(71) Applicant: COMMISSARIAT A L'ENERGIE ATOMIQUE ET AUX ENERGIES ALTERNATIVES, Paris (FR)

(72) Inventor: David Lachartre, Montbonnot (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 15/027,168

(22) PCT Filed: Oct. 2, 2014

(86) PCT No.: PCT/FR2014/052495
§ 371 (c)(1),
(2) Date: Apr. 4, 2016

(87) PCT Pub. No.: WO2015/049466
PCT Pub. Date: Apr. 9, 2015

(65) Prior Publication Data
US 2016/0248438 A1    Aug. 25, 2016

(30) Foreign Application Priority Data
Oct. 4, 2013 (FR) .................................... 13 59635

(51) Int. Cl.
*H04B 1/06* (2006.01)
*H03M 3/00* (2006.01)
(Continued)

(52) U.S. Cl.
CPC ........... *H03M 3/424* (2013.01); *H03M 1/125* (2013.01); *H03M 3/412* (2013.01); *H03M 3/464* (2013.01); *H04B 1/16* (2013.01); *H03M 1/48* (2013.01)

(58) Field of Classification Search
None
See application file for complete search history.

(56) References Cited

U.S. PATENT DOCUMENTS 7,298,305 B2 * 11/2007 Melanson ............... H03M 3/39
341/143
8,471,742 B2 * 6/2013 Lachartre .............. H03M 1/182
327/50

(Continued)

FOREIGN PATENT DOCUMENTS

FR    2 959 079 A1    10/2011

OTHER PUBLICATIONS

I-Hsin Wang, et al., "A 1V 5-bit 5GSample/sec CMOS ADC for UWB Receivers," International Symposium on VLSI Design, Automation and Test, VLSI-DAT 2007, 2007, pp. 1-4.

(Continued)

*Primary Examiner* — Lana N Le
(74) *Attorney, Agent, or Firm* — Oblon, McClelland, Maier & Neustadt, L.L.P.

(57) ABSTRACT

A device for quantizing an analog input signal, for supply of a continuous-time output signal quantized using a plurality of bits, includes a sign analysis electronic circuit, configured to supply a first signal representative of a first sign bit of the output signal, and an envelope analysis electronic circuit, including a comparator/quantizer with two inputs one of which receives the analog input signal, configured to supply a second signal representative of at least a second bit of the output signal, as a quantized envelope signal, and a feedback loop with continuous-time digital-to-analog conversion of the quantized envelope signal, arranged between the output (Continued)

and the other of the two inputs of the comparator/quantizer. The quantized envelope signal is a signal of which a low pass filtering is representative of the amplitude of an envelope signal of the input signal and the feedback loop includes a low pass filter.

10 Claims, 5 Drawing Sheets

(51) Int. Cl.
*H03M 1/12* (2006.01)
*H04B 1/16* (2006.01)
*H03M 1/48* (2006.01)

(56) References Cited

U.S. PATENT DOCUMENTS

2010/0279617 A1* 11/2010 Osman ............... H04B 17/104
455/63.1
2011/0255639 A1 10/2011 Lachartre
2013/0197858 A1* 8/2013 Egretzberger ......... G01C 19/56
702/145

OTHER PUBLICATIONS

S-W Chen, et al., "A Subsampling Radio Architecture for Ultrawideband Communications," IEEE Transactions on Signal Processing, vol. 55, No. 10, Oct. 2007, pp. 5018-5031.
David Lachartre, "A 550μW Inductorless Bandpass Quantizer in 65nm CMOS for 1.4-to-3GHz Digital RF Receivers," 2011 Symposium on VLSI Circuits (VLSIC), IEEE, XP032019467, 2011, pp. 166-167.
International Search Report issued Apr. 1, 2015 in PCT/FR2014/052495 filed Oct. 2, 2014.
French Search Report issued May 15, 2014 in FR 1359635 filed Oct. 4, 2013.

* cited by examiner

CONTINUOUS-TIME QUANTIZATION DEVICE, RADIO FREQUENCY SIGNAL RECEIVER COMPRISING SUCH A DEVICE AND CONTINUOUS-TIME QUANTIZATION METHOD

This invention relates to a continuous-time quantization device, a radio frequency signal receiver comprising such a device and a continuous-time quantization method.

The radio frequency signals are also generally called radio signals and by extension the receivers of radio frequency signals are generally qualified as radio receivers.

In the following description and claims, the following terminology will be used.

An "analog signal" is a signal that can vary continuously both over time and in amplitude.

A "quantized signal" is a signal that can vary at any instant, but taking only discrete values in amplitude.

A "sampled signal" is a signal that changes value at regular intervals over time, i.e. at discrete instants defined by a sampling frequency.

A "digital signal" is a sampled and quantized signal, i.e. that can have only discrete values, at regular intervals (discrete instants) over time.

A "continuous time" signal is a non-sampled signal, i.e. able to change value at any time, whether it is analog or quantized.

A "binary signal" is a continuous-time quantized signal using a maximum of two values. A quantized signal using more than two values can be transmitted in the form of several binary signals, each one representing one bit of the quantized signal.

"Decimate" means deleting a portion of the samples of a sampled signal in order to subsample the latter.

A "cycle" of a binary signal is the portion of the signal that extends from a predetermined transition of the signal, for example the transition of its high value to its low value, until the same following predetermined transition. In the case of a periodic signal or pseudo-periodic signal, one cycle therefore corresponds to one period or pseudo-period of the signal.

A "quantization device", or "quantizer", is a device that transforms an analog signal into a quantized signal, i.e. that provides a quantized signal of which the value depends on the value of the analog signal over the course of time.

The "positive envelope", subsequently called simply "envelope", of a signal is a low frequency curve as compared to the main frequency of the signal and seeking to join the peaks (local maxima) of the signal together. In the case of a carrier modulated only in amplitude, the envelope is the amplitude modulation. A signal taking positive and negative values also has a negative envelope seeking to join the peaks downwards (local minima) of the signal together. In the case of a signal that is symmetric in relation to zero, the negative envelope is substantially equal to the opposite of the positive envelope.

An analog-to-digital convertor if often an essential element of electronic devices, in particular of radio receivers with digital architecture wherein the radio signal coming from an antenna has to be digitized.

There are several techniques that have very different compromises.

The article entitled "1V 5-bit 5 GS/s CMOS ADC for UWB receivers", by I. Wang and S. Liu published in International Symposium on VLSI Design, Automation and Test, 2007, VLSI-DAT 2007, 25-27 Apr. 2007, pages 1-4, proposes a radio receiver provided with a fast analog-to-digital convertor that samples the radio signal at at least twice its highest frequency and using a relatively substantial number of bits. As the radio signal to be received can have a dynamics greater than 50 dB, a quantization using at least 8 bits may be required. Moreover, the higher the radio frequency is the higher the sampling frequency has to be. For example a signal emitted at 2.4 GHz must be sampled at at least 4.8 GS/s (i.e. sampling rate). A disadvantage of this convertor is that it consumes a substantial amount of energy, as its power can reach several watts.

Moreover, the article entitled "A Subsampling Radio Architecture for Ultrawideband Communications", by S-W Chen and E. W. Brodersen, published in IEEE Transactions on Signal Processing, Volume 55, Issue 10, October 2007, pages 5018-5031, proposes a radio receiver comprising an analog-to-digital convertor designed to sample the radio signal at less than twice its frequency. This is what is called "subsampling". The constraint of the speed of the convertor is released all the more so that the signal is subsampled but to the detriment of the quality of the converted signal. In particular the subsampling has for effect to alias the spectrum around the fundamental and harmonics of the sampling frequency. This aliasing causes to appear in the bandwidth of the radio signal interference signals coming from the aliased frequency bands. This technique of analog-to-digital conversion of the radio signal generally requires an initial filtering in order to suppress all of the interference signals that can be aliased. The more subsampled the signal is, the tighter the filtering has to be around its bandwidth. In addition, the sampling frequency cannot even so fall below the width of the bandwidth of the radio signal at the risk of aliasing it itself. Even when the signal is subsampled, the problem of the quantization requiring a large number of dynamic bits subsists. Furthermore, the sampling frequency cannot fall as low as could be desired.

The number of quantization bits that are usually encountered to convert the radio signals is of importance with regards to the complexity and therefore the consumption of the digital processing to be carried out in order to obtain a complete radio receiver. As such, even if the analog-to-digital convertor is not the main electrical consumption load, a large number of quantization bits penalizes the consumption of the whole. It is important to minimize this number regardless of the sampling frequency chosen.

In order to avoid the difficulties with sampling, some analog-to-digital convertors first comprise a continuous-time quantizer, with the continuous-time signal being sampled only later in the receiving chain.

As such, French patent published under number FR 2 922 388 B1 describes a device for the continuous-time quantization of an analog input signal, for the supplying of a continuous-time output signal quantized using a plurality of bits, with this device comprising:
  an electronic circuit designed to supply a first continuous-time binary signal representative of a first sign bit of the output signal, having at any instant a first value when the input signal is positive and a second value when the input signal is negative, and
  an electronic circuit designed to supply a second continuous-time quantized signal representative of several other bits of the output signal, representing more precisely the amplitude of the analog input signal.

Note that the use of one bit for the sign of the signal is of particular interest when the analog input signal is centered around zero as is the case with audio or radio signals for example. But this quantizer still has the disadvantage of requiring a large number of quantization bits.

French patent published under the number FR 2 959 079 B1 describes a device for the continuous-time quantization of an analog input signal, for the supplying of a continuous-time output signal quantized using a plurality of bits, it also comprising a sign analysis electronic circuit, designed to supply a sign bit of the output signal. It further comprises an envelope analysis electronic circuit, comprising a comparator/quantizer with two inputs one of which receives the analog input signal, designed to supply as output of the comparator/quantizer a second continuous-time quantized signal representative of at least a second bit of the output signal.

More precisely, in this document, the second signal is a binary signal, qualified as an envelope variation bit, taking a high or low value according to the variations of the envelope of the analog input signal. The sign analysis electronic circuit then comprises a feedback loop with an integration function, arranged between its output and the other of the two inputs of the comparator/quantizer, in such a way as to retrieve an estimation of the envelope of the analog input signal at the input of the comparator/quantizer.

It is then possible to obtain a continuous-time quantized signal using only two bits (sign bit and envelope variation bit), which represents relatively accurately the analog input signal. But the quantization error still remains however rather substantial.

It can thus be desired to provide a continuous-time quantizer that, although having the advantages of the quantizers proposed in documents FR 2 922 388 B1 and FR 2 959 079 B1, makes it possible to overcome at least one portion of the aforementioned problems and constraints.

A device is therefore proposed for the continuous-time quantization of an analog input signal, for the supplying of a continuous-time output signal quantized using a plurality of bits, comprising:
  a sign analysis electronic circuit, designed to supply a first continuous-time binary signal representative of a first bit of the output signal, called sign bit, having at any instant a first value when the input signal is positive and a second value when the input signal is negative,
  an envelope analysis electronic circuit, comprising:
    a comparator/quantizer with two inputs one of which receives the analog input signal, designed to supply as output of the comparator/quantizer a second continuous-time quantized signal representative of at least a second bit of the output signal, called quantized envelope signal, and
    a feedback loop with continuous-time digital-to-analog conversion of the quantized envelope signal, arranged between the output and the other of the two inputs of the comparator/quantizer,
wherein the quantized envelope signal is a signal of which a low pass filter is representative of the amplitude of an envelope signal of the input signal, and the feedback loop comprises a low pass filter.

In other terms, the feedback loop with continuous-time digital-to-analog conversion of the envelope analysis electronic circuit comprises a low pass filter in such a way as to reproduce, with the comparator/quantizer, the functional elements of a continuous-time Sigma Delta operator.

The term "continuous-time digital-to-analog conversion", means the conversion of a quantized signal using at least one bit into a corresponding analog signal, not a conventional conversion of a digital signal to an analog signal, since the signal to be converted is not sampled.

As such, thanks to the invention and to the low pass filtering that it proposes in the feedback loop with continuous-time digital-to-analog conversion, the envelope analysis electronic circuit reproduces the functional elements of a Sigma Delta operator generally used in conventional analog-to-digital conversion, with the exception however of the sampling function since the quantization device according to the invention is a continuous-time device that does not use any independent sampling clock, i.e. it provides a continuous-time output signal using an analog signal via analog processing circuits. Indeed, the quantizer of the comparator/quantizer fulfils a function of converting an analog signal into a quantized signal of which a low pass filter is representative of the amplitude of an envelope signal of the input signal, while the feedback loop fulfils the inverse function of continuous-time digital-to-analog conversion carrying out a low pass filter. It has been noticed that by replacing the integration function the feedback loop (cf. document FR 2 959 079 B1 which rather reproduces on its side the functional elements of a continuous-time Delta modulator) with a function of continuous-time digital-to-analog conversion with low pass filtering in such a way as to reproduce in continuous time the functional elements of a Sigma Delta operator, an unexpected technical effect takes place on the resulting output signal. By multiplying the sign bit and the quantized envelope signal, it is noticed that the signal obtained has a spectrum with harmonics wherein the noise bandwidths (in particular the noise in conventional 1/f produced by the loop of the envelope analysis circuit) are inserted without being superposed on the bandwidths of the useful signal. This effect is not produced in document FR 2 959 079 B1 and neither is this the effect expected of a conventional Sigma Delta operator.

Optionally, a continuous-time quantization device according to the invention can comprise a continuous-time quantized signal multiplier, with this multiplier receiving as input the sign bit and the quantized envelope signal and supplying as output the continuous-time product of the two signals that it receives as input.

Optionally also:
  the envelope analysis electronic circuit is designed to supply a binary signal at the output of the comparator/quantizer, with this binary signal being representative of a single second bit of the output signal, called envelope bit,
  the feedback loop is with continuous-time and with one bit digital-to-analog conversion of the envelope bit, and
  the multiplier is a logic Exclusive OR gate.

In this case, the sign bit and the quantized envelope signal are both binary signals. However, it is still very delicate and even not recommended to multiply binary signals between each other because this generally produces an intermodulated signal that has highly dispersed harmonics which makes it unusable. But in the particular context of the quantized envelope signal obtained thanks to the invention, the two binary signals obtained are in fact synchronous, even if one has a signal modulated by a carrier while the other has a baseband signal, and produce a signal at the output of the logic gate that has non-dispersed harmonics. This new unexpected effect makes the binary signal obtained as output from the multiplier particularly advantageous and representative of the analog input signal.

Also optionally, as the analog input signal is with modulation around a carrier frequency and with bandwidth less than the carrier frequency, the low pass filter has a cutoff frequency greater than half of said bandwidth.

Also optionally, the sign analysis electronic circuit comprises an asynchronous comparator.

Also optionally, the comparator/quantizer of the envelope analysis electronic circuit comprises a memory effect comparator.

Also optionally, the comparator/quantizer of the envelope analysis electronic circuit comprises:
- an asynchronous comparator, and
- an RS flip-flop of which a first input is connected as output of the asynchronous comparator of the envelope analysis electronic circuit and a second input is connected as output of the sign analysis electronic circuit.

Also optionally, the comparator/quantizer of the envelope analysis electronic circuit is followed, in the envelope analysis electronic circuit, by a D flip-flop having a clock input supplied by the sign bit provided by the sign analysis electronic circuit.

A radio frequency signal receiver is also proposed comprising:
- an antenna designed to capture a radio frequency signal and convert it into an electric signal,
- a continuous-time quantization device according to the invention in order to quantize in continuous time an analog input signal obtained using the electric signal supplied by the antenna,
- an electronic circuit of a local radio oscillator, designed to generate two local oscillation signals in quadrature with one another, and
- a double mixer electronic circuit, designed to supply two binary baseband electric signals in quadrature with one another, with these two baseband signals corresponding to the mixture of the product of the sign bit and of the quantized envelope signal with respectively the two local oscillation signals.

A continuous-time quantization method of an analog input signal is also proposed, intended to provide a continuous-time output signal quantized using a plurality of bits, comprising the following steps:
- providing a first continuous-time binary signal representative of a first bit of the output signal, called sign bit, having at any instant a first value when the input signal is positive and a second value when the input signal is negative,
- providing a second continuous-time quantized signal representative of at least a second bit of the output signal, called quantized envelope signal, via a comparison/quantization operation comprising a comparison of the analog input signal with a continuous-time signal resulting from a feedback loop with continuous-time digital-to-analog conversion of the quantized envelope signal, characterized in that the quantized envelope signal is a signal of which a low pass filter is representative of the amplitude of an envelope signal of the input signal, in that the feedback loop comprises a low pass filter, and in that the continuous-time signal resulting from this feedback loop is said envelope signal of the input signal.

The invention shall be better understood using the following description, provided solely as an example and made in reference to the annexed drawings wherein.

Figure 1:
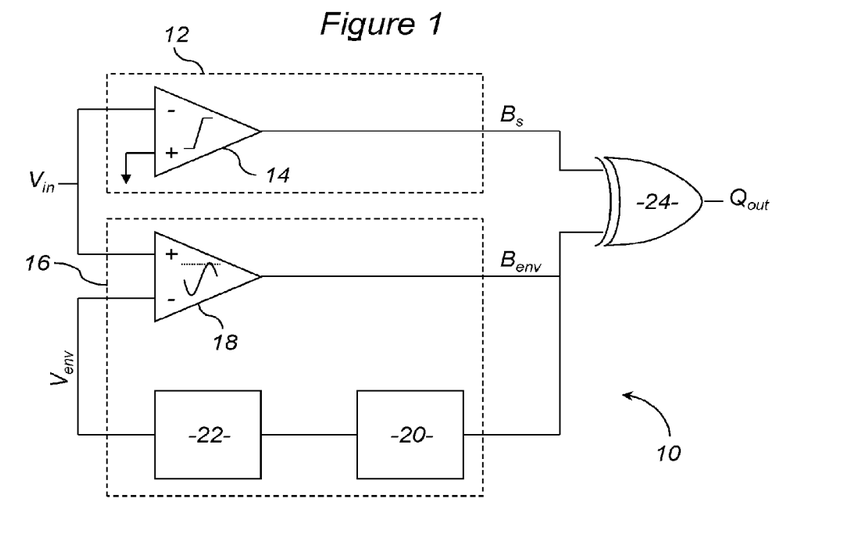
FIG. 1 diagrammatically shows a continuous-time quantization device, according to a first embodiment of the invention.

The continuous-time quantization device 10 shown in FIG. 1 comprises an input receiving an analog signal $V_{in}$ for the supplying of a continuous-time output signal quantized using a plurality of bits, for example using two bits. In the example described, the output signal is comprised of two continuous-time binary electric signals (also called logic signals), called respectively sign bit $B_s$ and envelope bit $B_{env}$, with this second signal being more generally an information-carrying quantized signal on the envelope of the input signal $V_{in}$. It is imposed, in the framework of this invention, that the second quantized signal $B_{env}$ be at every instant able to allow for an estimation of the amplitude of the envelope of the input signal $V_{in}$ by low pass filtering using a predetermined time window.

To this effect, the quantization device 10 first comprises a sign analysis electronic circuit 12, designed to supply the sign bit $B_s$ of the output signal. This sign bit $B_s$ takes a high value when the input signal $V_{in}$ is positive and a low value when the input signal $V_{in}$ is negative. It is therefore representative at any instant of the sign of the input signal $V_{in}$. In the example described, the sign analysis circuit 12 comprises an asynchronous comparator 14 of which the negative analog input receives the input signal $V_{in}$ of which the positive analog input is connected to an electric ground of the quantization device 10 and of which the binary output provides the sign bit $B_s$. An asynchronous comparator is a comparator designed to supply at any instant the result of the comparison of its analog inputs on its binary logic output, without requiring an independent clock, in such a way that this output is not sampled. The comparator 14 is as such designed to compare the input signal $V_{in}$ with the electrical ground and to provide the sign bit $B_s$ according to the result of the comparison.

The quantization device 10 further comprises an envelope analysis electronic circuit 16, designed to supply the envelope bit $B_{env}$ of the output signal. The envelope analysis circuit 16 is in this example designed to compare at any instant the input signal $V_{in}$ with an estimation $V_{env}$ of its envelope (i.e. the positive envelope defined hereinabove). It as such fulfils a function of peak detection. The envelope bit $B_{env}$ then takes a high value when the input signal $V_{in}$ is greater than its envelope $V_{env}$ and a low value in the opposite case. It is therefore representative at any instant of the envelope of the input signal $V_{in}$. More precisely, in light of what is imposed for this signal in the framework of the invention, it is comprised of a succession of values of which a low pass filter, substantially close to a running average, is representative of the amplitude of the envelope of the input signal by being at each instant proportional to this amplitude. More generally, the result of the peak detection could be quantized using a plurality of bits in such a way as to provide a quantized envelope signal that is more accurate than the envelope bit $B_{env}$, but the quantization of this signal using a single bit nevertheless provides satisfactory results.

In order to carry out the function of peak detection, the envelope analysis circuit 16 comprises, in a main branch, a comparator/quantizer 18 that can take the form, in the case of FIG. 1 where the quantized envelope signal is the envelope bit $B_{env}$, of a simple memory effect comparator and with a binary output. The positive analog input of this comparator/quantizer 18 receives the input signal $V_{in}$.

The envelope analysis circuit 16 further comprises a feedback loop with continuous-time digital-to-analog conversion of the envelope bit $B_{env}$, arranged between the binary output and the negative analog input of the comparator/quantizer 18.

This feedback loop optionally comprises a continuous-time digital-to-analog conversion element 20 that carries out a signal transposition, i.e. an electronic analog processing element that converts the envelope bit $B_{env}$, which is a continuous-time binary signal, into a corresponding analog signal but of which the minimum and maximum values are transposed in such a way as to surround the minimum and maximum values of the envelope $V_{env}$ of the input signal $V_{in}$. In other words, the conversion carries out a transposition in such a way that the maximum value of the signal obtained at the output of the conversion element 20 is greater than or equal to the maximum value of the envelope $V_{env}$ and that the minimum value of the signal obtained at the output of the conversion element 20 is less than or equal to the minimum value of the envelope $V_{env}$. Details on an embodiment of this conversion element 20 will be provided in reference to FIG. 7A. Such a conversion element 20 with a transposition function is not compulsory if the envelope bit $B_{env}$ is already carried, at the output of the comparator/quantizer 18, by a continuous-time signal of which the maximum value is greater than or equal to the maximum value of the envelope $V_{env}$ and of which the minimum value is less than or equal to the minimum value of the envelope $V_{env}$.

The feedback loop with continuous-time digital-to-analog conversion further comprises a low pass filter 22 arranged at the output of the continuous-time digital-to-analog transposition where applicable, or directly at the output of the comparator/quantizer 18 (via an electronic buffer circuit for impedance or admittance adaptation) if there is no conversion element 20. It is this low pass filter that provides the estimation $V_{env}$ of the envelope of the input signal $V_{in}$ at the output of the feedback loop. Details on the implementation of this low pass filter 22 in another possible embodiment of the conversion element 20 will be provided in reference to FIG. 7B. This low pass filter 22 is at least a first order RF filter. Such a low pass filter cannot in particular be mistaken for an integrator. Contrary to an integrator, it has a predetermined cutoff frequency at −3 dB $f_c$ below which the gain of the filter is substantially constant (i.e. between 0 and −3 dB) in relation to a maximum gain value $G_{max}$ and beyond which the gain of the filter is always less than $G_{max}-3$ dB.

The quantization device 10 further comprises a continuous-time signal multiplier 24 receiving the sign bit $B_s$ of the output signal provided by the sign analysis circuit 12 and the envelope bit $B_{env}$ of the output signal provided by the envelope analysis circuit 16. This multiplier 24 supplies as output a continuous-time binary signal of which the value at each instant is the product of the values at the same instant of the signals $B_s$ and $B_{env}$. This resulting signal, noted as $Q_{out}$, shall subsequently be called mixed output signal or output bit. In the example of FIG. 1, wherein the two signals $B_s$ and $B_{env}$ are binary, the multiplier can take the form of a simple logic Exclusive OR gate.

Figure 2:
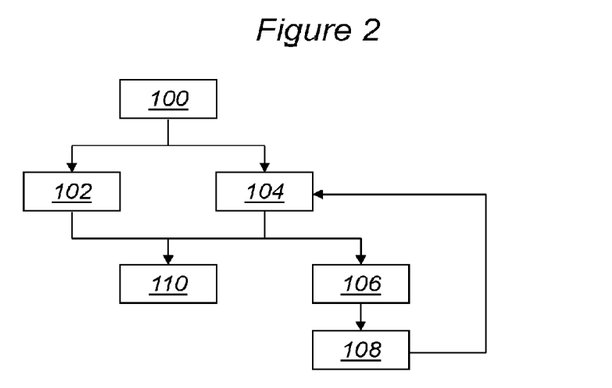
FIG. 2 shows the successive steps of a continuous-time quantization method according to the invention, implemented by the quantization device of FIG. 1, FIG. 3 diagrammatically shows the typical spectrum of a signal resulting from a processing of an analog input signal by the quantization device of FIG. 1, FIG. 4 diagrammatically shows a continuous-time quantization device, according to a second embodiment of the invention.

The operation of the quantization device 10 shall now be described in reference to FIG. 2.

During a first step 100, the quantization device 10 receives the analog input signal $V_{in}$.

During a step 102, the asynchronous comparator 14 compares the input signal $V_{in}$ with the ground in order to provide the sign bit $B_s$.

During a step 104, the comparator/quantizer 18 compares the input signal $V_{in}$ to the envelope signal $V_{env}$ returned by the feedback loop in order to provide the envelope bit $B_{env}$. This envelope signal $V_{env}$ is representative of the envelope of the input signal $V_{in}$ during a preceding cycle, with the feedback loop generating indeed a cycle shift.

During a step 106, the conversion element 20 of the feedback loop with continuous-time digital-to-analog conversion transposes, where applicable, the continuous-time signal that supports the envelope bit of a preceding cycle into an analog signal of which the maximum and minimum values surround the maximum and minimum values of the envelope signal $V_{en}$.

During a step 108 following the step 106, the low pass filter 22 filters this transposed analog signal in order to provide the aforementioned estimation $V_{env}$. The step 108 is followed, with a cycle shift, by a return to the step 104.

The steps 104, 106 and 108 as such constitute a loop of steps that carry out the Sigma Delta type operation in continuous time of the envelope analysis circuit 16. The difference detected by the comparator/quantizer 18 between the input signal $V_{in}$ and the envelope signal $V_{env}$ shows the quantization error produced in the chaining of the analog-to-quantized-to-analog conversions carried out by this loop of steps. By choosing one-bit conversions, the quantization error is substantial, but the filtering carried out in the step 108 substantially reduces its power at high frequency, which corresponds to a portion of the spectrum where most of the quantization error can be found.

Finally, during a step 110, the logic Exclusive OR gate 24 multiplies the sign bit $B_s$ and envelope bit $B_{env}$ in order to provide the output bit $Q_{out}$. This step has the effect of frequency translating the spectrum of the binary envelope signal $B_{env}$ around the fundamental frequency and harmonics of the sign bit $B_s$.

Note that in order to make the quantization device 10 as effective as possible, the envelope $V_{env}$ is estimated only over the maximums of a single polarity (here, positive). The consequences are that the bandwidth of the estimated envelope does not exceed half of the central frequency and that the same applies for the noise spectrum. There is then no risk of aliasing the noise on the useful signal when the envelope bit $B_{env}$ is multiplied by the sign bit $B_s$ in the step 110.

Figure 3:
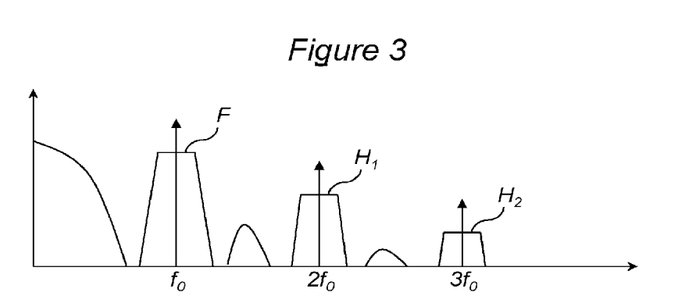

FIG. 3 diagrammatically shows the general form of a typical spectrum of the output bit $Q_{out}$ obtained using an analog input signal of the radiofrequency type, i.e. with a relatively narrow band around a high carrier frequency $f_0$. Through the effect of the quantization carried out by the device 10, this output bit $Q_{out}$ has a spectrum with fundamental F (around the carrier frequency $f_0$) and multiple harmonics $H_1$ (around the frequency $2 \cdot f_0$), $H_2$ (around the frequency $3 \cdot f_0$), etc. Moreover, through the effect of the feedback loop of the envelope analysis circuit 16 which makes possible the carrying out of an operation of the Sigma Delta type in continuous time, it is observed that the noise does not mix with the useful signal. The spectrum of the signal $Q_{out}$ comprises an alternation of frequency bands relative to the noise and to the signal, without these frequency bands overlap, even partially. As such, on either side of each harmonics of the useful signal is a noise band that does not overflow onto these harmonics. It is therefore very easy to select the fundamental frequency band of the useful signal arranged around the known carrier frequency $f_0$, using a simple suited bandwidth filtering around this carrier frequency. This filtering can be done digitally after digitization in the digitization chain that follows the quantization carried out by the device 10 for the obtaining of a good approximation of the input signal $V_{in}$.

Figure 4:
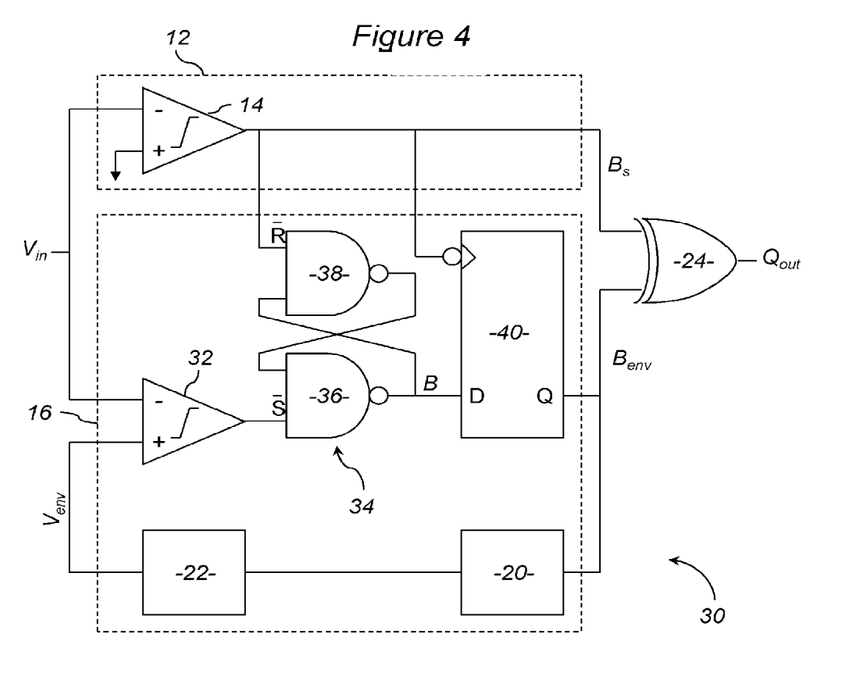

The continuous-time quantization device 30 shown in FIG. 4 differs from the quantization device 10 by the main branch for comparing/quantizing the envelope analysis circuit 16.

In accordance with this second embodiment, the main branch comprises an asynchronous comparator 32, identical to the asynchronous comparator 14, of which the negative analog input receives the input signal $V_{in}$, of which the positive analog input receives the envelope estimation $V_{env}$ at the output of the feedback loop and of which the binary output continuously provides a comparison bit of these two signals.

This comparison bit of signals $V_{in}$ and $V_{env}$ supplies the input $\overline{S}$ of an RS flip-flop 34 of which the input $\overline{R}$ is itself supplied by the output of the asynchronous comparator 14, i.e. by the sign bit $B_s$. In the example of FIG. 4, the RS flip-flop 34 is carried out using two logic NAND gates 36 and 38 as such is known per se. It supplies as output a continuous-time signal B corresponding to the comparison bit of signals $V_{1n}$ and $V_{env}$ wherein a high value appearing in a cycle of the sign bit $B_s$ is memorized, i.e. extended, until the end of this cycle.

Alternatively, the unit comprised of the asynchronous comparator 32 and of the RS flip-flop 34 can be replaced with a memory effect comparator, as in the first embodiment, directly supplying the signal B.

In accordance with the second embodiment, the main branch of the envelope analysis circuit 16 further comprises a maintaining element 40, designed to supply the envelope bit $B_{env}$ in such a way that it corresponds to the signal B wherein, for each cycle of the sign bit $B_s$, the value of the signal B of the beginning of the cycle is captured and maintained until the end of the cycle. As such, as the signal with sign $B_s$ depends on nothing else than the input signal $V_{in}$, the envelope bit $B_{env}$ remains quantized in continuous time and therefore is not affected by any spectrum aliasing. In the example described, the capture is carried out on the falling edges of the sign signal $B_s$. As such, in the example of FIG. 4, the maintaining element 40 is a D flip-flop designed to sample on the falling edges of its clock input. Its input D is connected to the output B of the RS flip-flop 34, its clock input is connected to the output of the asynchronous comparator 14, i.e. it is controlled by the sign bit $B_s$, and its output Q provides the envelope bit $B_{env}$. This results in that the envelope bit $B_{env}$ can be considered as "pseudo sampled" using the sign bit $B_s$.

As such, the RS flip-flop 34 and the maintaining element 40 form an electronic circuit designed to supply the envelope bit $B_{env}$ in such a way that it takes its high value over an entire cycle of the sign bit $B_s$ when the comparison bit of the signals $V_{in}$ and $V_{env}$ has taken its high value over at least one portion of the preceding cycle of the sign bit $B_s$, and its low value otherwise.

This second embodiment has the advantage of providing an envelope bit of which the transitions from one value to the other are separated by a duration that is always at least equal to the period of the carrier. As such, the values of the envelope bit $B_{env}$ correctly propagate at the output of the quantization device 30.

Figure 5A:
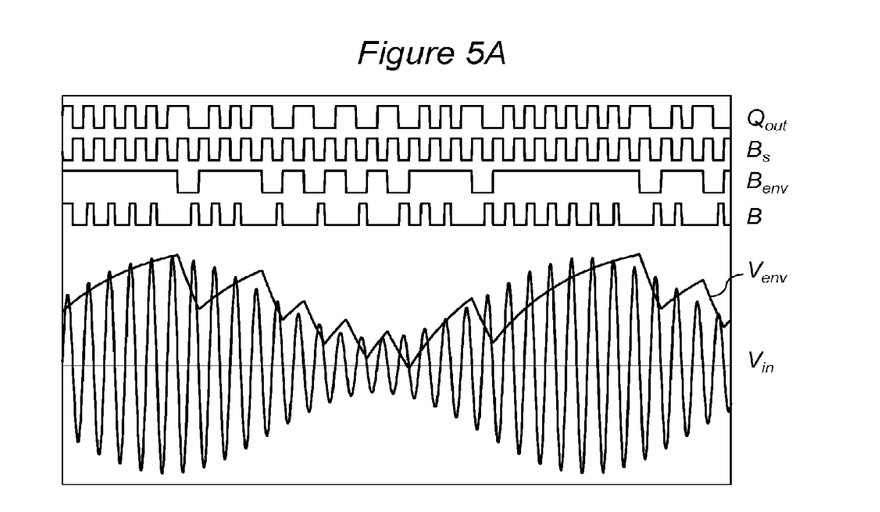
FIGS. 5A and 5B show, using diagrams, the change over the course of time of electric signals at different points of the quantization device of FIG. 3 during its operation.
Figure 5B:
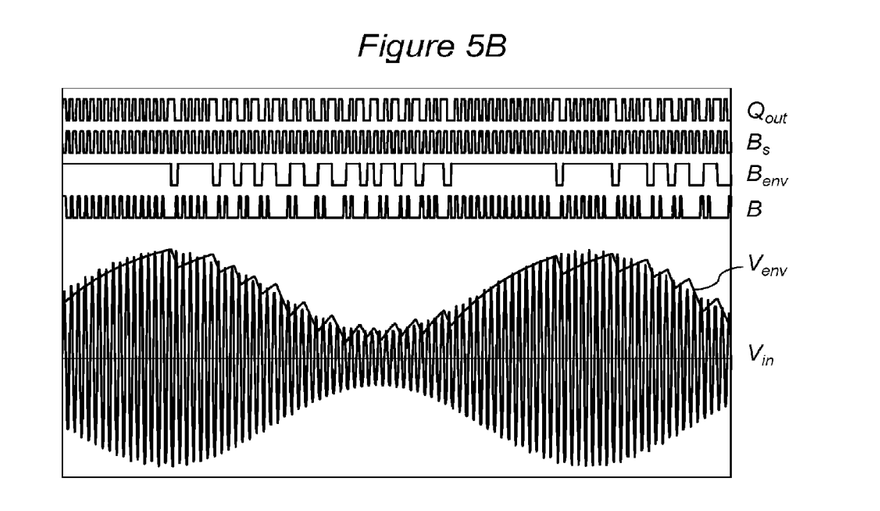

In order to more concretely show the operation of the quantization device 30, the variations over the course of time of a radio frequency input signal $V_{in}$, of the estimation $V_{env}$ of the envelope of this input signal, of the binary signal B for comparison of the input signal $V_{in}$ with the estimation $V_{env}$, of the envelope bit $B_{env}$, of the sign bit $B_s$ and of the resulting output bit $Q_{out}$ are shown using chronograms in FIG. 5A in the case of a broadband spectral input signal and in FIG. 5B in the case of a narrowband spectral input signal. It can be observed that the difference between the envelope estimated $V_{env}$ by the feedback loop and the input signal $V_{in}$ is more substantial for a broadband signal than for a narrowband signal. This observation can be generalized by considering that thanks to the continuous-time Sigma Delta conversion detailed hereinabove, the more a radio frequency signal has a narrow frequency band around its carrier, the higher the precision of the quantization device 10 or 30 is.

The quantization error produced by the envelope analysis circuit 16 in the example of FIG. 1 or 4 shall now be estimated, i.e. when the envelope signal is quantized using a single bit, in the case where the input signal $V_{in}$ is formed of a carrier with period $T_0$ (carrier frequency $f_0$ and carrier pulse $\omega_0$) modulated in amplitude. The amplitude of the non-modulated carrier is noted as $A_0$ and M(t) is the modulation function with values in [0,1] and which has a bandwidth noted as BW, less than $f_0$. The input signal $V_{in}$ is as such of the form $V_{in}=A_0 \cdot M(t) \cdot \sin(\omega_0 \cdot t)$.

In these conditions, the cutoff frequency $f_c$ of the low pass filter 22 must be more preferably chosen in such a way as to quantize the modulation function M(t), not the carrier. In order to have the bandwidth BW not truncated by this low pass filtering, the relation $f_0 > 2 \cdot f_c \geq BW$ must be satisfied. If the low pass filter 22 is of order 1 and the one-bit conversion element 20 generates an output voltage $V_{DAC}$, then $P=\pi \cdot f_c \cdot V_{DAC}$ is the slope of the signal $V_{env}$ which is compared to the input signal $V_{in}$. In order to prevent saturation, $V_{DAC}$ must be greater than or equal to $A_0$.

Figure 6:
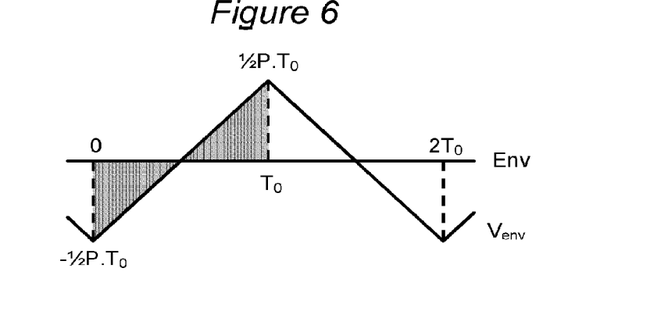
FIG. 6 is a graph showing the quantization error produced by a quantization device such as that of FIG. 1 or 4, FIGS. 7A and 7B diagrammatically show two embodiments of a continuous-time digital-to-analog conversion device of the quantization device of FIG. 1 or 4, and FIGS. 8A and 8B diagrammatically show two embodiments of a radio frequency signal receiver according to the invention.

FIG. 6 shows the change over the course of time of the theoretical envelope, noted as Env, i.e. of the amplitude modulation, assumed to be constant in this figure, and of the envelope signal $V_{env}$ obtained at the output of the feedback loop, i.e. more precisely at the output of the low pass filter 22.

As can be seen in this figure, the quantization error (hatched area) is the consequence of the approximation of the theoretical envelope of the input signal $V_{in}$ by a triangular signal of slopes +P and −P. Between two instants 0 and $T_0$, this curve is expressed by: $P \cdot t - \frac{1}{2} P \cdot T_0$. Note that in light of the expression of P, the smaller $f_c$ and $V_{DAC}$ are, the lower the quantization error is.

The equivalent quantization noise as an RMS value is given by:

$$\sigma = \sqrt{\frac{P^2}{T_0} \int_0^{T_0} (t - T_0/2)^2 \, dt} = \frac{P \cdot T_0}{\sqrt{12}}$$

It can as such be observed that there is the same equivalent quantization noise as a conventional analog-to-digital convertor for which $$\sigma = \frac{LSB}{\sqrt{12}}.$$

The factor $P \cdot T_0$, which is the minimum amplitude variation, is the equivalent of the LSB of a conventional analog-to-digital convertor.

The signal-to-noise ratio of the quantization can therefore be determined for an amplitude signal $A_0$ by:

$$SNR = \frac{\sqrt{6}}{\pi} \cdot \frac{f_0}{f_c} \cdot \frac{A_0}{V_{DAC}}$$

and $$SNR_{MAX} = \frac{\sqrt{6}}{\pi} \cdot \frac{f_0}{f_c}.$$

It can be seen that in order to increase the signal-to-noise ratio, it is interesting to increase the carrier frequency and to decrease the bandwidth, with the maximum bandwidth being set by the choice of $f_c$.

For example, by using a continuous-time quantization device according to the invention in the framework of the ZigBee standard wherein the frequency band extends from about 2.4 GHz to 2.48 GHz, the signal-to-noise ratio in this band of 80 MHz reaches at least 33 dB. With each emission channel being about 2 MHz in width, a signal-to-noise ratio of more than 65 dB per channel is reached, i.e. the equivalent of more than 10 bits of a Flash convertor running at 5 GS/s at least.

It is then understood that it is interesting to choose the value of $f_c$ in such a way as to encompass the entire frequency band able to contain useful signal. The quantization is carried out with an average signal-to-noise ratio. Then, the filtering of a narrower channel in this frequency band makes it possible to obtain a higher signal-to-noise ratio only for the desired signal.

Figure 7A:
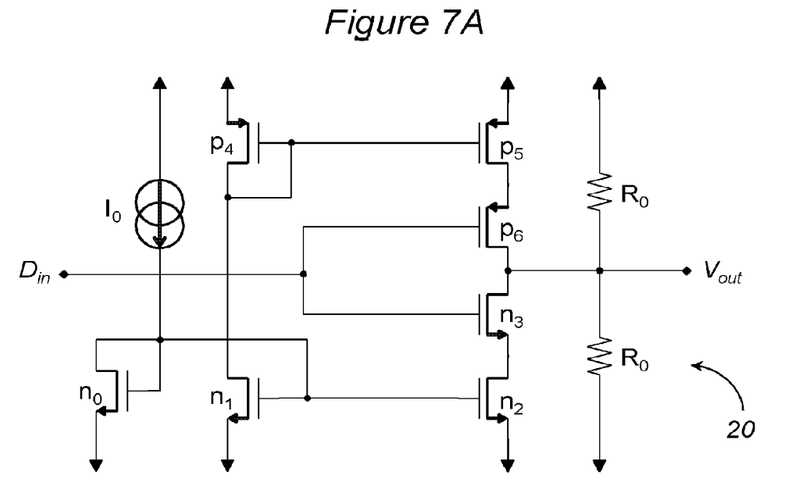

FIG. 7A shows an embodiment of the conversion element 20 of FIG. 1 or 4, i.e. a continuous-time and with one bit "digital" analog convertor carrying out a signal transposition. A binary signal $D_{in}$ supplied as input of this one-bit convertor is processed in order to be output in the form of a corresponding analog signal $V_{out}$. More precisely, the one-bit convertor 20 generates at any instant a positive voltage $V_{DAC}$ when its binary input $D_{in}$ is at 1 and a negative voltage $-V_{DAC}$ when its binary input $D_{in}$ is at 0. The common absolute value $V_{DAC}$ of these two voltages is nominally located around half of the supply voltage of the convertor.

The generation of voltages $V_{DAC}$ and $-V_{DAC}$ is carried out by a current $+I_0$ or $-I_0$, initially generated by a polarization current source $I_0$ arranged as input, in two resistors $R_0$ on the output $V_{out}$. A transistor $n_2$ forms the source of current $-I_0$ by pulling the current to 0 V (i.e. the ground) while a transistor $p_5$ supplies the current $+I_0$ since coming from the supply. Additional transistors $n_0$, $n_1$ and $p_4$ are arranged as shown in FIG. 7A in such a way that the pairs of transistors $(n_0, n_2)$, $(n_0, n_1)$ and $(p_4, p_6)$ form current mirrors that copy the polarization current $I_0$. Other transistors $p_6$ and $n_3$ operate as switches controlled by the binary input $D_{in}$. When $D_{in}$ is at 1, the transistor $p_6$ is blocked and does not allow the current coming from the transistor $p_5$ to pass. On the other hand, the transistor $n_3$ is rendered pass-through and allows the current to pass to the transistor $n_2$. Reciprocally when $D_{in}$ is at 0, the transistor $p_6$ is pass-through and the transistor $n_3$ blocked. The current $I_0$ is converted into voltage by the two resistors $R_0$ in parallel on the output $V_{out}$ in such a way that $V_{DAC} = \frac{1}{2} R_0 \cdot I_0$. It is as such advantageously possible to set the value of the current $I_0$ so that the value $V_{DAC}$ is always greater than or equal to the amplitude of the envelope signal $V_{env}$.

Figure 7B:
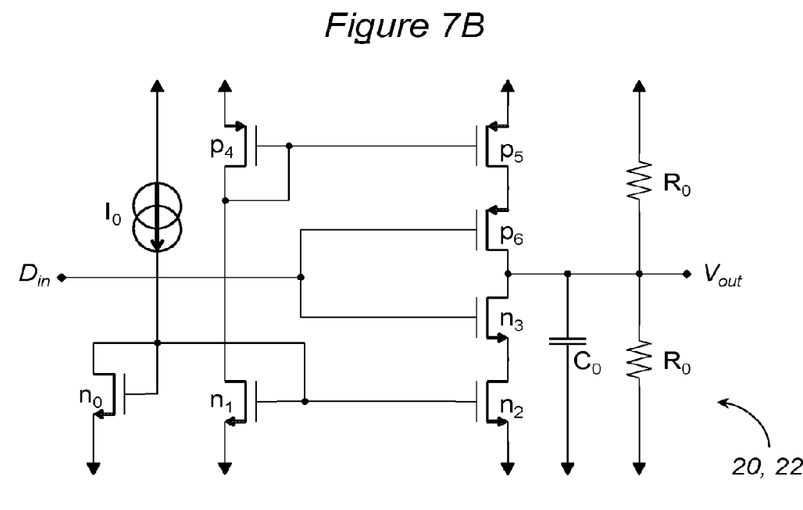

FIG. 7B shows an alternative of the example of FIG. 7A, wherein the low pass filter 22 is simply integrated into the conversion element 20. In order to carry out this insertion, it is sufficient to connect a capacitor $C_0$ on the output $V_{out}$. Indeed, thanks to the high impedance of the current-source transistors, the output impedance of the convertor is very close to $\frac{1}{2}R_0$, in such a way that the connection of the capacitor $C_0$ on the output $V_{out}$ creates a low pass filter of order 1 of which the cutoff frequency is:

$$f_c = \frac{1}{\pi \cdot R_0 C_0}$$

Although the quantization device of FIG. 1 or 4 is not limited to a radio frequency use, its integration into a radio frequency signal receiver shall now be described in reference to FIGS. 8A and 8B. Indeed, the quantization device according to the invention can be used in other devices, such as for example audio signal convertors, sensors of movement and of vibratory phenomena, and in particular those comprising an analog-to-digital convertor. Those skilled in the art will know how to adapt the quantization device of the invention to these applications. But it is true that this device is particularly well suited to the applications of radio receiving since the radio frequency signals received have a frequency-shifted spectrum with a bandwidth that is narrower than this shift.

Figure 8A:
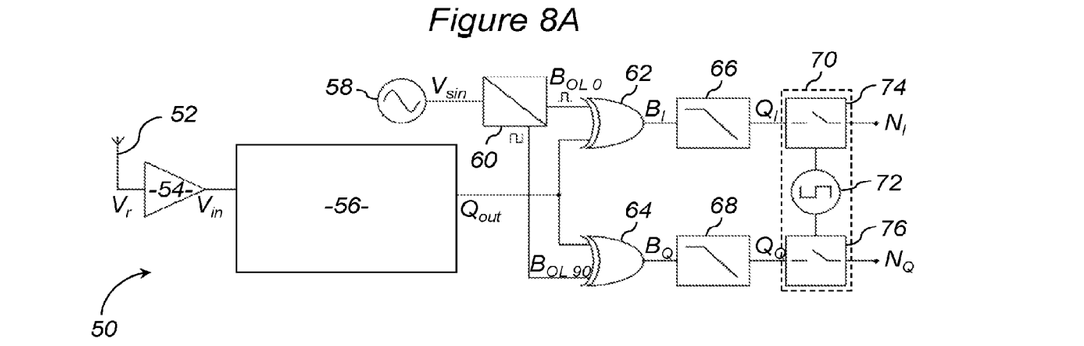

In reference to FIG. 8A, a receiver 50 of radio frequency signals according to a first embodiment of the invention first comprises an antenna 52 designed to capture a radio frequency signal and convert it into an electric signal noted as $V_r$. In the example described, the receiver 50 is a so-called IQ at zero IF receiver, i.e. with a zero intermediate frequency. The radio frequency signal comprises a high frequency carrier (typically from 30 KiloHertz to 100 GigaHertz), modulated by signal carrying the information to be transmitted, located generally in frequencies much less than those of the carrier.

The receiver 50 further comprises an amplifier 54 designed to amplify the signal $V_r$ with a low contribution to noise, such as a LNA (Low Noise Amplifier) amplifier. To this effect, the amplifier 54 is provided with an input connected to the antenna radio 52 and an output that supplies the electric analog input signal $V_{in}$ mentioned in reference to FIGS. 1 and 4.

The receiver 50 further comprises a continuous-time quantization device 56 of the input signal $V_{in}$ for supplying the continuous-time output bit $Q_{out}$ mentioned in reference to FIGS. 1 and 4. The quantization device 56 can therefore be comprised of one of the two devices 10 and 30 described hereinabove.

The receiver 50 further comprises a local oscillator 58, of which the output supplies a signal $V_{sin}$ which is square logic with values $-1$ and $+1$, and an electronic dephasing circuit 60, of which the input is connected to the output of the local oscillator 58 and of which the two outputs provide respectively local oscillation signals in phase $B_{OL\ 0}$ and in quadrature $B_{OL\ 90}$.

The receiver 50 further comprises an electronic device, called double mixer, designed to mix the continuous-time output bit $Q_{out}$ with respectively the two local oscillation signals $B_{OL\ 0}$ and $B_{OL\ 90}$. The term "mix" means an operation of which the result provides a signal that has at least one frequency equal to the difference of the frequencies of the two mixed signals and which forms the baseband in a zero IF receiver. The baseband is the frequency band that has the signal (indivisible) once demodulated or, equivalently, before it is modulated. The signal obtained by mixing furthermore has a frequency at the sum of the frequencies of the two mixed signals, which will be filtered as will be explained in what follows. The double mixer as such supplies two binary signals mixed respectively in phase $B_I$ and in quadrature $B_Q$ corresponding to the two preceding mixtures.

In the example of FIG. 8A, the double mixer comprises two multipliers, called respectively multipliers in phase 62 and in quadrature 64, each having an input receiving the output bit $Q_{out}$ and another input receiving, for the multiplier in phase 62, the local oscillation signal in phase $B_{OL\ 0}$, and, for the multiplier in quadrature 64, the local oscillation signal in quadrature $B_{OL\ 90}$. In this example also, the multipliers in phase 62 and in quadrature 64 are simple logic Exclusive OR gates since the signals multiplied together are all binary.

The receiver 50 further comprises two low pass filters, called respectively phase 66 and quadrature 68 low pass filters, provided with inputs respectively connected to the output of the multiplier in phase 62 and to the output of the multiplier in quadrature 64 and outputs that supply quantized signals, called baseband quantized signals respectively in phase $Q_I$ and in quadrature $Q_Q$. In the example described, the low pass filters 66 and 68 are continuous-time digital filters, i.e. the output signal is quantized but not sampled. Alternatively, the low pass filters 66, 68 could be analog filters, for example of the RC type, supplying baseband analog signals respectively in phase and in quadrature.

The low pass filters 66, 68 are furthermore anti-aliasing filters, i.e. fulfil a function of reducing the aliasing effect that risks occurring in a double sampler 70 of the receiver 50 that will be described hereinbelow. To this effect, the cutoff frequency of the low pass filters 66, 68 is chosen less than half of the sampling frequency. As such, the low pass filters 66, 68 only address the aliasing problem. In particular, they do not necessarily carry out the function of channel filtering.

The double sampler 70 is designed to sample at low frequency the two baseband quantized signals $Q_I$ and $Q_Q$ so as to provide two baseband digital signals in phase $N_I$ and in quadrature $N_Q$.

In the example of FIG. 8A, the double sampler 70 comprises a clock 72 provided with an output that supplies a baseband binary clock signal, and two samplers, called respectively phase 74 and quadrature 76 samplers, of which the inputs are connected to the clock 72 and to the output of the respectively anti-aliasing phase 66 and quadrature 68 low pass filters, and of which the outputs supply the baseband digital signals in phase $N_I$ and in quadrature $N_Q$.

In the case where the low pass filters are analog, each sampler 74, 76 is in fact an analog-to-digital convertor comprising a quantization circuit (not shown) in order to, in addition to the sampling, quantize the baseband analog signals.

Note that the sampling is carried out far in the receiving chain, in particular after the mixing 62, 64. As such, the sampling can be carried out at a baseband frequency, which makes it possible to reduce the consumption in energy of the double sampler 70.

Generally, the double sampler 70 is followed by digital filters (not shown) that fulfil a function of carrying out a true channel filtering. These channel filters are generally low pass filters, but can also be band-pass filters. In both cases, these filters are characterized by cutoff slopes much steeper than those of the anti-aliasing filters 66, 68.

Note that the radio receiver 50 was described in the case of a readjustment of the received radio frequency signal into baseband, but as an alternative, the invention also operates with a radio receiver that converts the signal received into intermediate frequency (heterodyning).

Figure 8B:
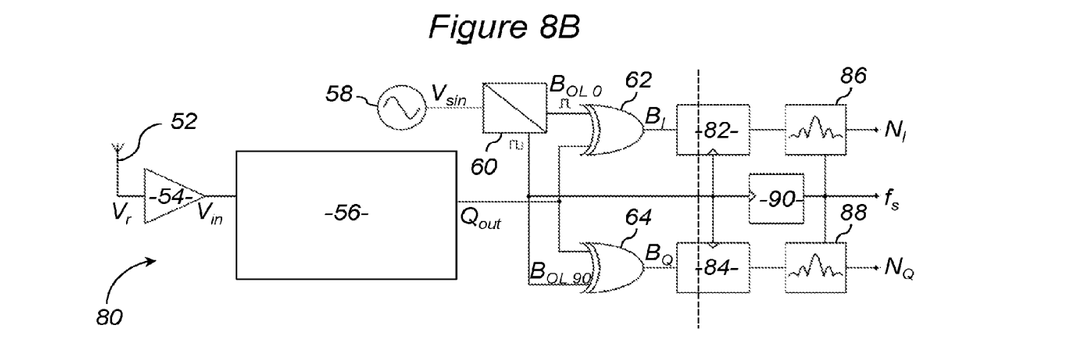

In reference to FIG. 8B, a receiver 80 of radio frequency signals according to a second embodiment of the invention comprises the same elements (same references) as those of the receiver 50 until the obtaining of the two binary signals mixed respectively in phase $B_I$ and in quadrature $B_Q$.

In this embodiment, advantage is taken of the local oscillator 58 to replace the low pass filters 66, 68 with two Sigma Delta analog-to-digital convertors 82 and 84 also conventionally able to naturally carry out the function of anti-aliasing low pass filtering. One of the two local oscillation signals, for example the signal $B_{OL\ 90}$, is as such supplied to the two Sigma Delta convertors 82, 84 in order to carry out the oversampling proper to Sigma Delta convertors. Indeed, the frequency of the local oscillator 58 is sufficiently high to produce a good oversampling ratio. Alternatively, it is also possible to use another independent clock without this being detrimental to reception. The vertical dashed line shown in FIG. 8B on the two Sigma Delta convertors 82, 84 symbolically shows the border between the continuous-time signals, located upstream in the receiving chain, and the sampled signals, located downstream. As Sigma Delta convertors 82, 84 are well known to those skilled in the art, no further details shall be provided here.

In this embodiment also, conventionally and due to the presence of the Sigma Delta convertors 82, 84, the receiver 80 comprises two decimators 86, 88 arranged respectively at the output of the two convertors 82, 84 in order to reduce the frequency of the samples to a lower frequency $f_s$. To do this, the receiver 80 further comprises a module 90 for generating a decimation factor N, capable of producing this frequency $f_s$ using that of the local oscillation signal $B_{OL\ 90}$, and also capable of providing the decimation factor N to the two decimators 86, 88. In this way, the baseband digital signals in phase $N_I$ and in quadrature $N_Q$ mentioned hereinabove can be supplied to the sampling frequency $f_s$ at the output of the two decimators 86, 88. An example of a particularly effective decimator that can be used for the elements 86 and 88 is a CIC ("Cascaded Integrated Comb") filter.

It appears clearly that a quantization device such as the one described hereinabove makes it possible to obtain a quantized signal using very few bits (up to two bits) without excessive loss of information and with a good discrimination between noise and useful signal. A technical field that relates to the invention is that of radio communications and wireless transmissions, but not exclusively.

Note moreover that the invention is not limited to the embodiments described hereinabove. It will appear indeed to those skilled in the art that various modifications can be made to the embodiments described hereinabove, in light of the teaching that has just been disclosed to them. In particular, a quantization device according to the invention can be used in devices other than a receiver of radio frequency signals. Moreover, a quantization device according to the invention can provide an output signal quantized using more than two bits.

In the following claims, the terms used must not be interpreted as limiting the claims to the embodiments disclosed in this description, but must be interpreted to include therein all of the equivalents that the claims aim to cover due to their formulation and of which the prevision is within the scope of those skilled in the art by applying their general knowledge to the implementing of the teaching that has just been disclosed to them.

The invention claimed is:

1. A continuous-time quantization device of an analog input signal, for supplying of a continuous-time output signal quantized using a plurality of bits, comprising:
   a sign analysis electronic circuit, configured to supply a first continuous-time binary signal representative of a first bit of the output signal, as a sign bit, having at any instant a first value when the input signal is positive and a second value when the input signal is negative;
   an envelope analysis electronic circuit, comprising:
      a comparator/quantizer with two inputs one of which receives the analog input signal, configured to supply as an output of the comparator/quantizer a second continuous-time quantized signal representative of at least a second bit of the output signal, as a quantized envelope signal; and
      a feedback loop with continuous-time digital-to-analog conversion of the quantized envelope signal, arranged between the output and the other of the two inputs of the comparator/quantizer;
   wherein the quantized envelope signal is a signal of which a low pass filtering is representative of amplitude of an envelope signal of the input signal, and the feedback loop comprises a low pass filter configured to reproduce, with the comparator/quantizer, functional elements of a continuous-time Sigma Delta operator.

2. The continuous-time quantization device according to claim 1, further comprising a continuous-time quantized signal multiplier receiving as an input the sign bit and the quantized envelope signal and supplying as an output the continuous-time product of the two signals that it receives as the input.

3. The continuous-time quantization device according to claim 2, wherein:
   the envelope analysis electronic circuit is configured to supply a binary signal at the output of the comparator/quantizer, with the binary signal being representative of a single second bit of the output signal, as an envelope bit,
   the feedback loop is with continuous-time and with one bit digital-to-analog conversion of the envelope bit, and
   the multiplier is a logic Exclusive OR gate.

4. The continuous-time quantization device according to claim 1, wherein the analog input signal is with modulation around a carrier frequency and with bandwidth less than the carrier frequency, and the low pass filter has a cutoff frequency greater than half of the bandwidth.

5. The continuous-time quantization device according to claim 1, wherein the sign analysis electronic circuit comprises an asynchronous comparator.

6. The continuous-time quantization device according to claim 1, wherein the comparator/quantizer of the envelope analysis electronic circuit comprises a memory effect comparator.

7. The continuous-time quantization device according to claim 1, wherein the comparator/quantizer of the envelope analysis electronic circuit comprises:
   an asynchronous comparator, and
   an RS flip-flop of which a first input is connected as an output of the asynchronous comparator of the envelope analysis electronic circuit and a second input is connected as an output of the sign analysis electronic circuit.

8. The continuous-time quantization device according to claim 1, wherein the comparator/quantizer of the envelope analysis electronic circuit is followed, in the envelope analysis electronic circuit, by a D flip-flop having a clock input supplied by the sign bit provided by the sign analysis electronic circuit.

9. A receiver of radio frequency signals comprising:
   an antenna configured to capture a radio frequency signal and convert the radio frequency signal into an electric signal;
   a continuous-time quantization device according to claim 1 for quantizing in continuous time an analog input signal obtained using the electric signal supplied by the antenna;
   an electronic circuit of a local radio oscillator, configured to generate two local oscillation signals in quadrature with one another; and
   a double mixer electronic circuit, configured to supply two binary baseband electric signals in quadrature with one another, with the two baseband signals corresponding to the mixture of the product of the sign bit and of the quantized envelope signal with respectively the two local oscillation signals.

10. A continuous-time quantization method of an analog input signal, configured to provide a continuous-time output signal quantized using a plurality of bits, comprising:
   providing a first continuous-time binary signal representative of a first bit of the output signal, as a sign bit, having at any instant a first value when the input signal is positive and a second value when the input signal is negative;
   providing a second continuous-time quantized signal representative of at least a second bit of the output signal, as a quantized envelope signal, via a comparison/quantization operation comprising a comparison of the analog input signal with a continuous-time signal resulting from a feedback loop with continuous-time digital-to-analog conversion of the quantized envelope signal;
   wherein the quantized envelope signal is a signal of which a low pass filtering is representative of amplitude of an envelope signal of the input signal, the feedback loop comprises a low pass filtering configured to reproduce, with the comparison/quantization operation, a continuous-time Sigma Delta operation, and the continuous-time signal resulting from the feedback loop is the envelope signal of the input signal.

* * * * *